(12) United States Patent
Braun et al.

(10) Patent No.: US 7,403,020 B2
(45) Date of Patent: Jul. 22, 2008

(54) METHOD AND DEVICE FOR MEASURING CAPACITANCES

(75) Inventors: Augustin Braun, Karlsdorf-Neuthard (DE); Friedrich Bohnmüller, Karlsruhe (DE)

(73) Assignee: acam-messelectronic GmbH, Stutensee-Blankenloch (DE)

( * ) Notice: Subject to any disclaimer, the term of this patent is extended or adjusted under 35 U.S.C. 154(b) by 0 days.

(21) Appl. No.: 11/381,786

(22) Filed: May 5, 2006

(65) Prior Publication Data

US 2006/0250144 A1    Nov. 9, 2006

(30) Foreign Application Priority Data

May 7, 2005    (DE)    .................. 10 2005 021 215

(51) Int. Cl.
*G01R 27/26*    (2006.01)
(52) U.S. Cl. .................. 324/678; 324/686; 324/658
(58) Field of Classification Search .................. 324/678, 324/686, 658
See application file for complete search history.

(56) References Cited

U.S. PATENT DOCUMENTS

| | | | | |
|---|---|---|---|---|
| 3,460,032 A | * | 8/1969 | Morning et al. | ............. 324/678 |
| 3,581,196 A | * | 5/1971 | Spaid | ............. 324/678 |
| 4,558,274 A | * | 12/1985 | Carusillo | ............. 324/607 |
| 4,621,227 A | * | 11/1986 | Venema | ............. 324/678 |
| 4,806,846 A | * | 2/1989 | Kerber | ............. 324/678 |
| 5,294,889 A | * | 3/1994 | Heep et al. | ............. 324/678 |
| 6,008,660 A | * | 12/1999 | Mahlbacher | ............. 324/661 |
| 6,191,723 B1 | * | 2/2001 | Lewis | ............. 341/166 |
| 6,366,098 B1 | * | 4/2002 | Froment | ............. 324/678 |
| 2004/0051396 A1 | | 3/2004 | Supper et al. | |
| 2005/0099198 A1 | | 5/2005 | Puma et al. | |

FOREIGN PATENT DOCUMENTS

| | | |
|---|---|---|
| CA | 2 255 225 | 6/1999 |
| DE | 3490412 T1 | 9/1985 |
| DE | 36 39 070 A1 | 8/1987 |
| DE | 10157529 B4 | 6/2003 |
| DE | 103 42 472 A1 | 4/2005 |
| GB | 2 102 959 | 2/1983 |
| WO | WO 94/06002 | 3/1994 |
| WO | WO 2006/002301 | 1/2006 |

* cited by examiner

*Primary Examiner*—Diego Gutierrez
*Assistant Examiner*—Thomas Valone
(74) *Attorney, Agent, or Firm*—McGlew & Tuttle, P.C.

(57) ABSTRACT

For measuring unknown capacitances, which exist in capacitive sensors, such as pressure, moisture, inclination sensors and the like, the invention proposes a capacitance measurement method, in which a capacitance to be measured is charged and discharged across a resistor and the charging or discharging time up to a preset voltage value is measured and in which the charging/discharging times of a known reference capacitance and stray capacitances are measured across a resistor. The invention also proposes a circuit for measuring an unknown capacitance to be measured and having a voltage source, a resistor for charging or discharging at least the measuring capacitor, at least one switch for connecting and disconnecting the measuring capacitor with respect to the voltage supply and a time measuring device, in which switches are provided for connecting and disconnecting the measuring capacitor and at least one reference capacitor with respect to the circuit.

27 Claims, 2 Drawing Sheets

METHOD AND DEVICE FOR MEASURING CAPACITANCES

FIELD OF THE INVENTION

The invention relates to a capacitance measuring method, in which a capacitance to be measured is charged and discharged across a resistor and the charging or discharging time up to a preset voltage value is measured, as well as to a circuit for measuring an unknown capacitance to be measured with a voltage supply, a resistor for charging or discharging at least the measurement capacitance, at least one switch for connecting and disconnecting the measuring capacitance with respect to the voltage supply and a time measuring device.

BACKGROUND OF THE INVENTION

As a function of the state of the parameter to be measured, capacitive sensors have different unknown capacitances, which must be determined for obtaining the indicated parameters. Such capacitive sensors are e.g. pressure sensors, moisture sensors, inclination sensors or the like, which are widely used in measurement technology.

In sensor systems with capacitive sensors the capacitances of the sensors are generally very small and of the order of magnitude of parasitic or stray capacitances of the measurement network, such as line capacitances, connection capacitances of connected ICs, as well as miscellaneous capacitances of electronic parts in the measuring network. With respect to the low capacitances of the capacitive sensors, such stray capacitances are not negligible, because they are also in the picoFarad range of the measuring capacitance and also have a not inconsiderable temperature variation, leading to temperature-dependent measuring errors and in particular to a span error.

In the case of measuring arrangements with capacitive sensors in the high temperature range of several hundred degrees Celsius, in which the measuring and reference capacitance can still be made temperature-stable, they are operated offset via a cable to avoid overheating of the electronics. Said cable, generally a coaxial cable, has a significant inherent capacitance (e.g. 60 pF/m), which is frequently higher than the measuring and reference capacitance. There are significant gains and offset errors, which can rapidly lead to a no longer acceptable range.

It is known that such stray capacitances can be suppressed in that the sensor signal of the inner conductor of the particular coaxial cable is decoupled with an amplifier having a +1 amplification and said signal is applied to the coaxial cable screen. Thus, the coaxial cable screen is at the same potential as the inner conductor. As no potential difference arises, in the ideal case no current flows in the stray capacitor and there is no measured value falsification. However, a disadvantage of this procedure is that several analog amplifiers are required which must have a very good quality, because otherwise as a result of phase shifts in the analog amplifier and the noise thereof additional errors can arise, which can sensitively influence the compensation effect of this method.

Whilst avoiding the aforementioned disadvantages, the problem of the invention is to provide a method and a device for measuring the capacitances of capacitive sensors where, whilst excluding stray capacitances, it is possible at limited cost to obtain high measuring rates during measurements with small operating currents.

SUMMARY OF THE INVENTION

According to the invention the set problem is solved by a method of the aforementioned type and which is characterized in that charging/discharging times of a known reference capacitance and stray capacitance are measured across a resistor. The stray capacitances are those from the line system and consequently other than the measuring capacitance, which is additionally measured according to the invention.

For solving the problem of the invention, a device is provided which is characterized in that there are switches for the connection and disconnection of the measuring capacitance and at least one reference capacitance from the circuit. The aforementioned switch for the disconnection from the voltage supply in particular disconnects the measuring capacitance, but preferably also all further components of the circuit, i.e. the residual circuit, from the voltage supply. Through the switches for the reference and measuring capacitance they are disconnected from the other components, particularly the line system, so as to create the prerequisite for measuring the stray capacitance of the line system.

As a result of the method and device according to the invention, it is possible to very precisely determine the capacitance of the capacitive sensor to be measured, because as a result of the inventive procedure stray capacitances and other unknown quantities of the measuring network can be eliminated. Consequently, according to a preferred development of the invention, the measured results or the values obtainable therefrom and in particular the charging and/or discharging times can be brought into a mutual relationship such that the stray capacitances are eliminated or through a device for bringing into a relationship the measuring results or values measured therefrom and in particular the charging and/or discharging times, it is possible to eliminate the stray capacitances.

Thus, according to a preferred variant the stray capacitance and optionally the running time of the comparator are eliminated by subtracting the measured charging/discharging time of the isolated measurement of the stray capacitance from the measured charging/discharging time of the running time measurement across the stray capacitance and measuring or reference capacitance and respectively the charging/discharging times of all the capacitances present in the measuring network, measuring capacitance, reference capacitance and total capacitance of all the capacitances present, are measured.

Through the compensation of the capacitive capacitances, it is possible to significantly increase the precision of the measurement of the measuring capacitance to be determined compared with known methods with respect to the amplification error by a factor of more than 5 and with respect to the zero drift by a factor of more than 10. The invention in particular obviates analog amplifiers with the inherent disadvantages thereof in high temperature measurements.

According to a preferred development the determination of the rising above or dropping below a specific voltage value necessary for measuring the charging or discharging times takes place by means of a comparator, which is preferably a Schmitt trigger.

Whereas more particularly when measuring the discharge times charging can take place with the resistor connected to earth or ground, according to a preferred development the charging of capacitances takes place with the resistor disconnected from earth or ground. As a result during charging of the capacitors no unnecessary currents flow through the resistor. The resulting current saving is in particular of interest because a stray current through the resistor flowing in the absence of the switch during charging and with low measuring rates would represent the greatest As a result of the aforementioned, preferred variant, in the case of very small measuring rates, e.g. under 20 Hz, very low operating currents in the lower µA range, such as below 10 µA can be obtained. This makes it possible to feed the inventive device using solar cells and to perform the inventive method using a solar cell supply. However, even if in the indicated case charging takes place with the resistor earthed or grounded, this has no negative effects on the measurement quality.

According to a preferred development the switches are switched through a control unit, such as an analog multiplexer, whilst the time measurement takes place by means of a time-digital converter (TDC). When using such a time meter or chronometer it is possible to obtain a time resolution higher by a factor of 100 to 1000 compared with known time measurements, so that the measuring frequency is e.g. more than 0.5 kHz, preferably more than 10 kHz. Measuring frequencies into a range of approximately 50 kHz and higher can be implemented and therefore rapid measurements can be achieved, which is highly interesting in certain applications, such as e.g. pressure sensors.

Moreover, in the case of chronometers other than TDCs, because there the actual measuring time would have to be higher by a factor of 100 to 1000, the resistance can be increased by said factor, whereas the resistance in the method according to the invention can be approximately 50 k$\Omega$, preferably lower than 50 k$\Omega$. However, in some other meter solution it would be 5 to 50 M$\Omega$. such a different measuring arrangement would be very high ohmic and much greater stray resistance problems would occur, e.g. through contamination. In addition, the EMC problem would be much greater than in the inventive solution with a TDC as the chronometer.

According to an alternative, preferred variant of the method, the charging/discharging time of the stray capacitances is measured in isolation or the charging or discharging times of all the capacitances present in the measuring network, namely measuring capacitance, reference capacitance and stray capacitances are measured.

Thus, according to a preferred development, the inventive device is a switch for disconnecting and connecting the resistor to and from the capacitance side remote from the voltage supply. As a result of the circuit according to the invention, the latter is preferably integrated into an integrated circuit (IC).

According to the possibilities resulting from the method, according to a further development of the inventive circuit the resistance is at least 1 k$\chi$, preferably more than 10 k$\chi$. The capacitive sensors usable with the circuit according to the invention have low capacitances, such as 5 to 50 pF. Thus, for avoiding additional interference and for increasing the EMC resistance, it is advantageous for the capacitances and resistance to be switched to earth.

BRIEF DESCRIPTION OF THE DRAWINGS

Further advantages and features of the invention can be gathered from the claims and the following description of a preferred embodiment of the invention with reference to the attached drawings, wherein show:

DETAILED DESCRIPTION OF THE INVENTION

Figure 1:
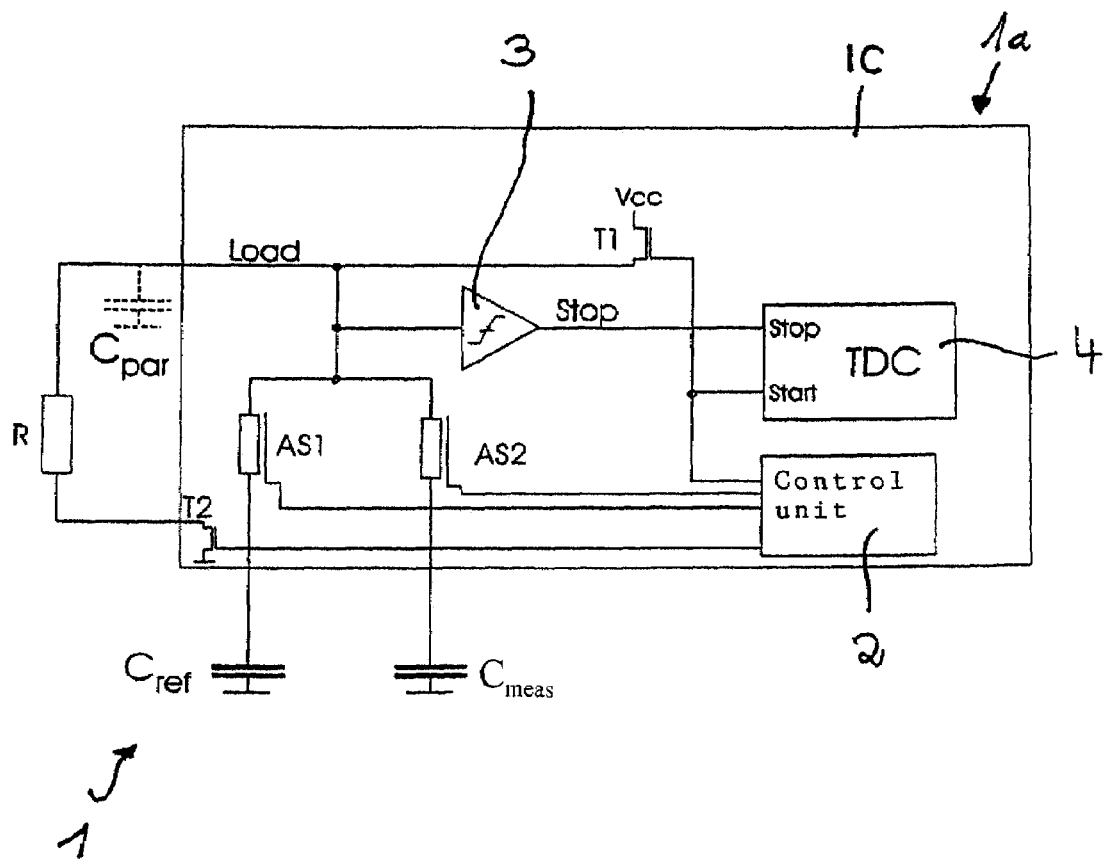
FIG. 1 A schematic circuit diagram of a first preferred development of the inventive device.

The inventive device 1 has a circuit 1a in the form of a FC with a voltage supply $V_{cc}$, which is connectable across a first electronic switch T1 (transistor switch) to a measuring capacitance $C_{meas}$ of a capacitive sensor, such as a pressure, moisture, inclination sensor or the like, a reference capacitance $C_{ref}$ and a resistor R, which are all arranged in parallel and which with the side thereof remote from the voltage supply $V_{cc}$ are in each case earthed. An analog switch AS1, AS2 is in each case associated with the measuring capacitance $C_{meas}$ and the reference capacitance $C_{ref}$. The resistor R can be switched across a switch T2.

Switch T2 is not necessary for the measuring function and could therefore be eliminated. Its sole function is to ensure that no unnecessary currents flow through the resistor during capacitance charging. This leads to a current saving, which is extremely advantageous, because the stray current through the resistor during charging and with low measuring rates would constitute the highest load. This also makes it possible in the case of low measuring rates, such as <20 Hz, to implement very low operating currents in the lower micrometer range, such as <10 μm, and therefore permit e.g. a solar cell usability of the measuring system. The omission of switch T2 has no negative effects on the measurement quality.

A control unit 2 is provided for switching switches T1, T2, AS1, AS2. The charging/discharging thresholds are determined by a comparator 3 (with respect to a reference value) and the start and finish of the charging process and preferably the discharging process and consequently the charging and preferably discharging time are determined by a TDC 4 (TDC=time digital converter).

Stray or spurious capacitances of the measuring network, such as due to lead capacitances, input capacitances of comparator 3 and the analog switch and also the connecting cable to the sensor capacitance $C_{meas}$ are covered by a stray capacitance $C_{par}$ represented in broken line form.

The arrangement comprising control unit 2, TDC 4, comparator 3, switches T1, T2, AS1, AS2 and the voltage supply for the measuring network can be in an integrated circuit IC, from which the leads pass to capacitances $C_{meas}$, $C_{ref}$ and discharging resistor R.

Whereas fundamentally the charging of the resistors and the charging times for determining the sensor capacitance $C_{meas}$ to be measured can be measured, preferably the discharging times are measured. Thus, a preferred embodiment of the inventive method involves the following measuring processes:

Individual Measurement 1

Initially switch T1 of voltage supply $V_{cc}$ and analog switch AS1 are closed, whereas switch T2 of resistor R and switch AS2 are open. Consequently the reference capacitance is charged to the operating voltage of voltage supply $V_{cc}$.

Then switch T2 is closed and switch T1 is switched high ohmic (i.e. opened), so that discharging takes place of reference capacitor $C_{ref}$ across resistor R. The time measurement of the TDC starts with this switching process.

Reference capacitor $C_{ref}$ is discharged across resistor R and analog switch AS1 until the voltage of reference capacitor $C_{ref}$ drops below the trigger threshold of comparator 3, so that the time measurement of the $TDC_s$ is stopped. The measured time $t_1$ is $$t_1 = (C_{ref} + C_{par})*R + t_{comp} \quad (1)$$

$t_{comp}$ being the comparator running time.

Individual Measurement 2

Initially switch T1 of voltage supply $V_{cc}$ and analog switch AS2 are closed, whereas switch T2 of resistor R and switch AS1 are opened. Thus, the reference capacitance can be charged to the operating voltage of voltage supply $V_{cc}$.

Switch T2 is then closed and switch T1 is switched high ohmic (i.e. opened), so that discharging takes place of reference capacitor $C_{meas}$ across resistor R. The time measurement of the TDC starts with this switching process.

Reference capacitor $C_{meas}$ is discharged across resistor R and analog switch AS2 until the voltage of reference capacitor $C_{meas}$ drops below the trigger threshold of comparator 3, so that the TDC time measurement is stopped. The measured time $t_2$ is $$t_2 = (C_{ref} + C_{par})*R + t_{comp} \tag{2}$$

Individual Measurement 3a

Here again, initially switch T1 is closed, whereas switch T2 is opened. In the first alternative both switches AS1 and AS2 are opened, so that capacitors $C_{mess}$ and $C_{ref}$ are disconnected from the voltage supply. Thus, only the stray capacitance $C_{par}$ of the measuring network is charged.

After charging switch T1 is switched high ohmic, i.e. the voltage supply $V_{cc}$ is disconnected from the measuring network and switch T2 is closed, so that the resistor is connected to earth on its side remote from the voltage supply $V_{cc}$. Therefore the measuring network or the stray capacitance $C_{par}$ formed by it is discharged. The time measurement of the TDC starts with the switching of said switches. On dropping below the preset threshold of comparator 3 the time measurement is ended, so that the measured time $t_{12}$ is $$t_{12} = C_{par}*R + t_{comp} \tag{3}$$

As a result of the measurements performed it is possible to eliminate the stray capacitance $C_{par}$ and the capacitance $C_{meas}$ of the sensor to be measured are determined whilst taking account of the measurement times and the known reference capacitance $C_{ref}$ so as to give:

$$C_{meas}/C_{ref} = (t_2 - t_{12})/(t_1 - t_{12}) \tag{4}$$

During conversion there is also a reduction in the dependence on the discharge resistor R and the comparator running time $t_{comp}$, so that, as is apparent from the formula, all that remains is the ratio of the two capacitances as a function of the measured measuring times. This compensated result is much more stable over temperature and voltage changes than the uncompensated result.

Individual Measurement 3b

Instead of measuring the running time during the discharge of the stray capacitance alone, it is alternatively possible to use the measuring time of the discharge of all the capacitances $C_{par}$, $C_{ref}$ and $C_{meas}$.

In this case both analog switches AS1 and AS2 become or remain closed during the charging of the capacitances/capacitors, i.e. after the closing of switch T1, whereas switch T2 is opened when present.

For discharging purposes switch T1 is once again switched high ohmic, i.e. voltage supply $V_{cc}$ is disconnected from the measuring network and switch T2 is closed. Analog switches AS1 and AS2 remain closed. Consequently there is a discharge of all the capacitances $C_{par}$, $C_{meas}$, $C_{ref}$ across resistor R, the time being determined through the sum of the capacitances. TDC time measurement starts on discharge. Discharging once again takes place until there is a drop below the threshold of comparator 3 and the measured time is $$t'_{12} = (C_{par} + C_{ref} + C_{meas})*R + t_{comp} \tag{5}$$

Through the conversion of the measurement equations it is once again possible to obtain the ratio of the capacitance to be measured to the reference capacitance as $$C_{meas}/C_{ref} = (t_1 - t'_{12})/(t_2 - t'_{12}) \tag{6}$$

With regards to the reduction of the time fraction RC of stray capacitance $C_{par}$ and therefore the stray capacitance as such, as well as the discharge resistance R and the running time $t_{comp}$, what was stated hereinbefore again applies.

Figure 2:
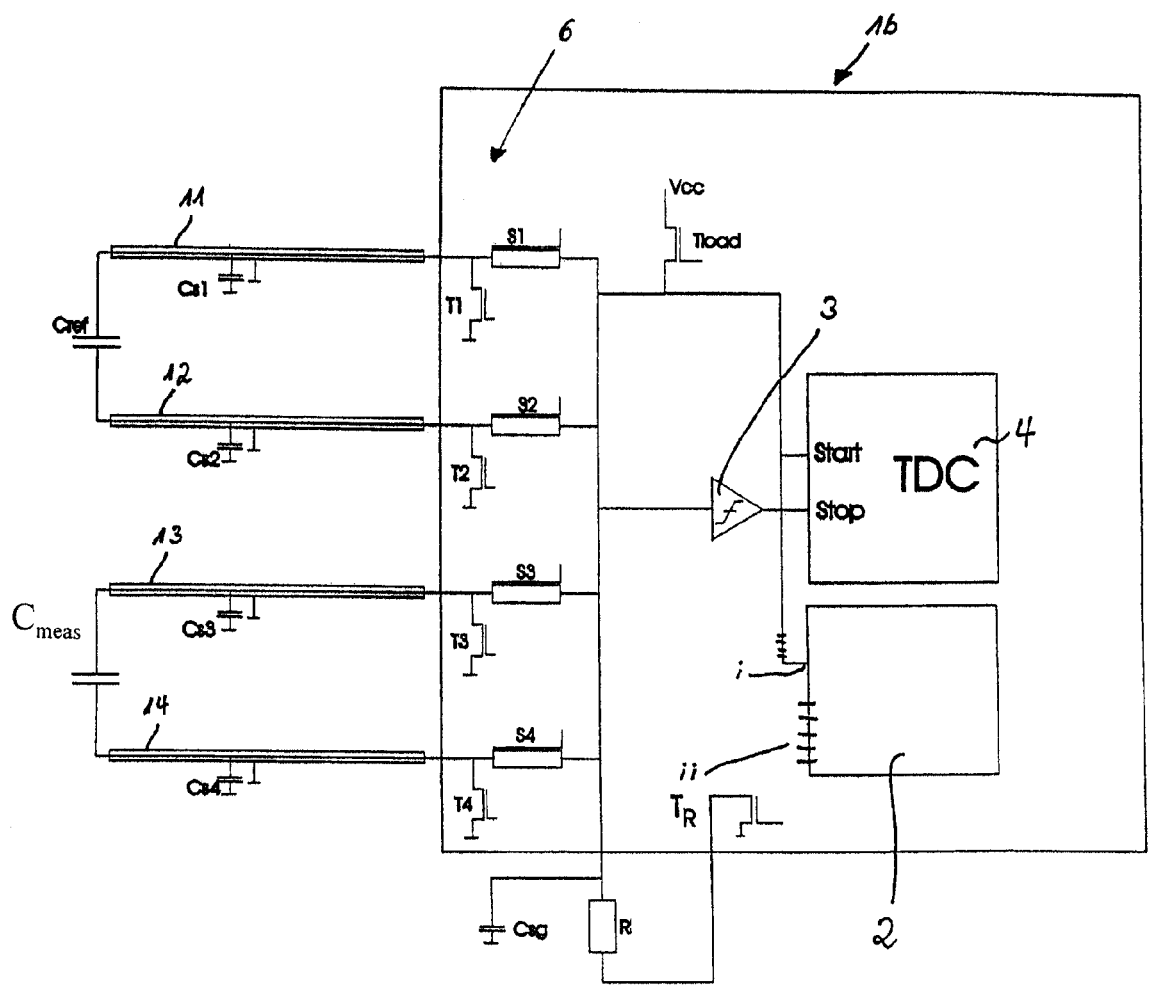
FIG. 2 A schematic circuit diagram of a further preferred development of the inventive device.

FIG. 2 shows another preferred development of the invention, which is in particular used where it is not possible to ignore the stray capacitances between the capacitors ($C_{ref}$ and $C_{meas}$) to be measured and the switches AS1, AS2 (FIG. 1). This is e.g. the case in high temperature applications where the electronics, due to corresponding high temperatures at the sensors, have to be operated in offset manner e.g. across a coaxial cable. Also in the case of very low measuring and reference capacitances in the lower picoFarad range the errors resulting therefrom can be so significant that it can no longer be ignored. Once again reference and measuring capacitors $C_{ref}$ and $C_{meas}$ are provided in a high temperature range. Once again the inventive device has circuit electronics 1b, which in the development according to FIG. 2 has a voltage supply $V_{cc}$, a control unit 2 and a TDC 4, together with a comparator 3 connecting the same to the measuring network 6. The circuit is connectable or disconnectable with respect to the voltage supply $V_{cc}$ by means of a charging transistor switch $T_{load}$. With the electronics 1b can be associated a charging resistor R, connectable to earth by means of a switch $T_R$ and which can therefore be connected into the measuring circuit or disconnected from earth, so that it can be removed from the measuring circuit and made ineffective.

The reference and measuring capacitors $C_{ref}$ and $C_{meas}$ are in this case connected to the measuring circuit 6 across coaxial cables 11, 12, 13, 14. The measuring circuit essentially comprises electronic analog switches S1, S2, S3, S4 and transistor switches T1, T2, T3, T4. By means of transistor switches T1 to T4 the reference and measuring capacitors $C_{ref}$, $C_{meas}$ and, across the individual transistor switches, also the stray capacitances $C_{S1}$, $C_{S2}$, $C_{S3}$, $C_{S4}$ of coaxial cables 11 to 14 can be connected to earth and therefore also to the voltage supply, whereas analog switches S1, S2, S3, S4, reference and measuring capacitors $C_{ref}$, $C_{meas}$ and also the individual capacitances $C_{S1}$ to $C_{S4}$ of coaxial cables 11 to 14 can be connected to the TDC across comparator 3. Switches S1 to S4 and T1 to T4 are controlled by means of control unit 2, which is represented by a not shown microprocessor. In order not to overburden representation the control lines between the control unit 2 and the switching terminals of switches S1, S4, T1, T4 are not shown. However, the drawing is to be understood in such a way that from the switching terminal i of switch S1 a control line leads to terminal i of control unit 2 and from switching terminal ii (base) of the transistor switch T1 a control line leads to the corresponding terminal ii of control unit 2. The same applies with regards to the control terminals of the other switches S2 to S4 and T2 to T4, without this being shown in detail.

The stray capacitance of measuring circuit 6 is shown as capacitance $C_{sg}$. This is necessarily also measured during all the measurements and consequently enters the different time determinations.

For the evaluation and in particular the determination of the measuring capacitance $C_{meas}$ (with known reference capacitance $C_{ref}$) according to the invention the time measurement shown in table 1 are performed using TDC 4:

| Measurement | | S1 | S2 | T1 | T2 | S3 | S4 | T3 | T4 |
|---|---|---|---|---|---|---|---|---|---|
| 1 | T11 = (Cref + Cs1 + Csg) * R + $t_{comp}$ | 1 | 0 | 0 | 1 | 0 | 0 | 1 | 1 |
| 2 | T12 = (Cref + Cs2 + Csg) * R + $t_{comp}$ | 0 | 1 | 1 | 0 | 0 | 0 | 1 | 1 |
| 3 | T13 = (Cs1 + Cs2 + Csg) * R + $t_{comp}$ | 1 | 1 | 0 | 0 | 0 | 0 | 1 | 1 |
| 4 | T21 = (Cmess + Cs3 + Csg) * R + $t_{comp}$ | 0 | 0 | 1 | 1 | 1 | 0 | 0 | 1 |
| 5 | T22 = (Cmess + Cs4 + Csg) * R + $t_{comp}$ | 0 | 0 | 1 | 1 | 0 | 1 | 1 | 0 |
| 6 | T23 = (Cs3 + Cs4 + Csg) * R + $t_{comp}$ | 0 | 0 | 1 | 1 | 1 | 1 | 0 | 0 |
| 7 | Tsg = Csg * R + $t_{comp}$ | 0 | 0 | 1 | 1 | 0 | 0 | 1 | 1 |

The measurements 1 to 7 performed are numbered consecutively. The aforementioned switches apparent from FIG. 2 are designated S1 to S4 and T1 to T4. The measuring times obtained using TDC 4 are represented as T11, T12, T13, T21, T22, T23 and Tsg and are obtained on connecting the capacitances into the measurement branch and are shown in the corresponding equation in brackets to the right of the equality sign. The capacitances indicated there are connected in the measuring circuit in the switch positions given for the corresponding equation line under switches S1 to S3 and T1 to T4, where "1" means that the corresponding switch is closed, whereas "0" means that the corresponding switch is opened.

Thus, for measuring measuring time T11 of reference capacitance $C_{ref}$ the stray capacitance $C_{s1}$ and the coaxial conductor 11 across switch S1 are included in the measurement cycle and the stray capacitance $C_{sg}$ of the measuring switch is also jointly determined, whereas through the closed switch T2 the inner conductor of coaxial cable 12 and the still earthed outer conductor thereof and the open switch S2 are extracted from the measuring cycle. This also applies to the stray capacitances $C_{s3}$, $C_{s4}$ in accordance with the switch positions to the right in the table under measurement 1 (S3, S4 opened, T3, T4 closed, so that inner conductor earthed). The same also applies regarding the further measurements 2 to 6, together with measurement 7, where through the disconnection of all the stray capacitances as well as the reference and measuring capacitance $C_{ref}$, $C_{meas}$ on the basis of the switch position shown there is only the measuring time Tsg (also influenced by the running time $t_{comp}$ of comparator 3) resulting from the measurement of the stray capacitance of measuring circuit 6.

On the basis of the seven equations obtained from the seven measurements, it is clear that the stray capacitances $C_{s1}$ to $C_{s4}$ corresponding to the following equations, in which both stray capacitance $C_{sg}$ of measuring circuit 6 and also the running time $t_{comp}$ of comparator 3 drop out of the equations as a result of the additions and subtractions provided in the equations and consequently are not involved in the determination of the stray capacitances $C_{s1}$, $C_{s4}$:

$$Cs1 = 0.5*(T11-T12+T13-Tsg)/R \quad (7a)$$

$$Cs2 = 0.5*(T12-T11+T13-Tsg)/R \quad (7b)$$

$$Cs3 = 0.5*(T21-T22+T23-Tsg)/R \quad (7c)$$

$$Cs4 = 0.5*(T22-T21+T23-Tsg)/R \quad (7d)$$

As a result of the measurements performed it is possible to determine the relationship of measuring capacitance $C_{meas}$ to reference capacitance $C_{ref}$ and only the measuring times of the measurements performed are involved:

$$C_{meas}/C_{ref} = (T_{21}+T_{22}-T_{23}-T_{sg})/(T_{11}+T_{12}-T_{13}-T_{sg}) \quad (8)$$

The stray capacitances $C_{s1}$ to $C_{s4}$ are relatively constant and their change over the temperature is relatively low frequency. The equations calculating these capacitances are therefore preferably averaged up, such as over 100 to 1000 time measurements. As a result of this averaging operation the noise of the measured values of said stray capacitances is very greatly suppressed, so that essentially it no longer plays any part. The determination and subtraction of these values leads to no additional noise involvement in the measurement. This is a major advantage which must not be underestimated.

The resistance values with respect to switches and transistors S1 to S4 and T1 to T4 should be clearly lower than the resistance value of resistor R, in order to minimize the influence thereof on the measured result. As in conventional sensor capacitors with capacitances of 10 to 100 pF a R of 5 to 200 kOhm is chosen, it is readily possible with existing technologies to select the switch resistances lower than R by more than a factor of 1000. If the entire circuit is integrated into a single IC, there is a very good synchronous behaviour of the analog switches and transistors. As a result the error influence of said components is so low that it is no longer significant.

Another advantage of the variant according to FIG. 2 is that now through the nature of the control the average d.c. level at the measuring and reference capacitances $C_{meas}$ and $C_{ref}$ is zero. This is a condition required by some sensors in order to function correctly (e.g. some moisture sensors).

LIST OF REFERENCE NUMERALS

| | |
|---|---|
| 1 | Device |
| 1a | Circuit |
| 1b | Circuit electronics |
| 2 | Control unit |
| 3 | Comparator |
| 4 | TDC |
| 6 | Measuring circuit |
| 7 | Measurement |
| 11-14 | Coaxial cables |
| AS1, AS2 | Analog switches |
| $C_{par}$ | Stray capacitance |
| $C_{meas}$ | Measuring capacitance |
| $C_{ref}$ | Reference capacitance |
| $C_{s1}$-$C_{s4}$ | Stray capacitances |
| $C_{sg}$ | Capacitance |
| IC | Integrated circuit |
| i, ii | Switching terminal |
| R | Resistor |
| $RC_{par}$ | Time fraction |
| S1-S4 | Analog switches |
| t1, t2, t'12 | Time |
| $t_{comp}$ | Comparator running time |
| $T_{load}$ | Load switch |
| T1-T4, T11-T13, T21-T23 | Transistor switches |
| Tsg | Measuring times |
| $T_R$ | Switch |
| $V_{cc}$ | Voltage supply |

The invention claimed is:

1. A method for measuring a capacitance, the method comprising:

measuring a time for charging or discharging a known reference capacitance $C_{ref}$ and unknown stray capacitances $C_{par}$ based on a comparator running time $t_{comp}$ by $$t_1=(C_{ref}+C_{par})*R+t_{comp} \quad (1);$$

measuring a time for charging or discharging a known capacitance to be measured $C_{meas}$ and unknown stray capacitances $C_{par}$ based on said comparator running $t_{comp}$ by $$t_2=(C_{meas}+C_{par})*R+t_{comp} \quad (2);$$

measuring a time for charging or discharging stray capacitances $C_{par}$ based on said comparator running time $t_{comp}$ by $$t_{12}=C_{par}*R+t_{comp} \quad (3);$$

determining said capacitance to be measured $C_{meas}$ by eliminating said stray capacitances $C_{par}$ as well as the comparator running time $t_{comp}$ according to:

$$\frac{(t_2-t_{12})}{(t_1-t_{12})} = \frac{(((C_{meas}+C_{par})*R+t_{comp})-(C_{par}*R+t_{comp}))}{(((C_{ref}+C_{par})*R+t_{comp})-(C_{par}*R+t_{comp}))} = \frac{(C_{meas}*R)}{(C_{ref}*R)}$$

and accordingly $$C_{meas} = \frac{C_{refr}*(t_2-t_{12})}{(t_1-t_{12})}; \text{ and}$$

determining a sensor parameter based on said measured capacitance $C_{meas}$.

2. A method according to claim 1, wherein passing above or below a threshold voltage value necessary for determining the charging or discharging times is determined by means of a comparator.

3. A method according to claim 2, wherein the determination of the passing above or below of said voltage threshold value necessary for measuring the charging or discharging times takes place using a Schmitt trigger as the comparator.

4. A method according to claim 2, wherein the connection or disconnection of a voltage supply is provided by means of a transistor switch.

5. A method according to claim 1, wherein charging of the capacitances takes place with the resistor disconnected from earth.

6. A method according to claim 1, wherein switches are switched by a control unit, such as an analog multiplexer.

7. A method according to claim 1, wherein measurement takes place repeatedly with measuring frequencies of more than 0.5 kHz.

8. A method according to claim 1, wherein the measurements are performed with operating currents below 50 µA.

9. A method according to claim 1, wherein the time measurements are carried out by a time to digital converter (TDC).

10. A method for measuring a capacitance, the method comprising:

measuring a time for charging or discharging a known reference capacitance $C$ ref and unknown stray capacitances $C_{par}$ based on a comparator running time $t_{comp}$ by $$t_1=(C_{ref}+C_{par})*R+t_{comp} \quad (1);$$

measuring a time for charging or discharging a known capacitance to be measured $C_{meas}$ and unknown stray capacitances $C_{par}$ based on said comparator running $t_{comp}$ by $$t_2=(C_{meas}+C_{par})*R+t_{comp} \quad (2);$$

measuring a time for charging or discharging the known reference capacitance $C_{ref}$, the unknown capacitance to be measured $C_{meas}$ and the unknown stray capacitance $C_{par}$ based on the comparator running time $t_{comp}$ by $$t'_{12}=(C_{par}+C_{ref}+C_{meas})*R+t_{comp} \quad (3);$$

determining the capacitance to be measured $C_{meas}$ by eliminating the stray capacitances $C_{par}$ par as well as the comparator running time $t_{comp}$ according to $$\frac{(t_2-t'_{12})}{(t_2-t'_{12})} =$$
$$\frac{(((C_{ref}+C_{par})*R+t_{comp})-((C_{par}+C_{ref}+C_{meas})*R+t_{comp}))}{(((C_{meas}+C_{par})*R+t_{comp})-((C_{par}+C_{ref}+C_{meas})*R+t_{comp}))} = \frac{(C_{meas}*R)}{(C_{ref}*R)}$$

and accordingly $$C_{meas} = \frac{C_{ref}*(t_1-t'_{12})}{(t_2-t'_{12})}$$

determining a sensor parameter based on said measured capacitance $C_{meas}$.

11. A method according to claim 10, wherein passing above or below a threshold voltage value necessary for determining the charging or discharging times is determined by means of a comparator.

12. A method according to claim 11, wherein the determination of the passing above or below of said voltage threshold value necessary for measuring the charging or discharging times takes place using a Schmitt trigger as the comparator.

13. A method according to claim 11, wherein the connection or disconnection of a voltage supply is provided by means of a transistor switch.

14. A method according to claim 10, wherein charging of the capacitances takes place with the resistor disconnected from ground.

15. A method according to claim 10, wherein switches are switched by a control unit, such as an analog multiplexer.

16. A method according to claim 10, wherein measurement takes place repeatedly with measuring frequencies of more than 0.5 kHz.

17. A method according to claim 10, wherein the measurements are performed with operating currents below 50 µA.

18. A method according to claim 10, wherein the time measurements are carried out by a time to digital converter (TDC).

19. A method for determining an unknown capacitance $C_{meas}$ to be measured, the method comprising:

connecting a known reference capacitance $C_{ref}$ connected to the unknown capacitance to be measured $C_{meas}$ via connecting lines having individual stray capacitances Cs1-Cs4;

providing a power source $v_{cc}$;

connecting the reference capacitance $C_{ref}$ and unknown capacitance $C_{meas}$ to said power source via switches S1 to S4; connecting the reference capacitance $C_{ref}$ and unknown capacitance $C_{meas}$ to a ground via transistor switches T1 to T4;

charging or discharging the capacitances and determining the charging or discharging times according to the following scheme:

| Measurement | | S1 | S2 | T1 | T2 | S3 | S4 | T3 | T4 |
|---|---|---|---|---|---|---|---|---|---|
| 1 | T11 = (Cref + Cs1 + Csg) * R + $t_{comp}$ | 1 | 0 | 0 | 1 | 0 | 0 | 1 | 1 |
| 2 | T12 = (Cref + Cs2 + Csg) * R + $t_{comp}$ | 0 | 1 | 1 | 0 | 0 | 0 | 1 | 1 |
| 3 | T13 = (Cs1 + Cs2 + Csg) * R + $t_{comp}$ | 1 | 1 | 0 | 0 | 0 | 0 | 1 | 1 |
| 4 | T21 = (Cmess + Cs3 + Csg) * R + $t_{comp}$ | 0 | 0 | 1 | 1 | 1 | 0 | 0 | 1 |
| 5 | T22 = (Cmess + Cs4 + Csg) * R + $t_{comp}$ | 0 | 0 | 1 | 1 | 0 | 1 | 1 | 0 |
| 6 | T23 = (Cs3 + Cs4 + Csg) * R + $t_{comp}$ | 0 | 0 | 1 | 1 | 1 | 1 | 0 | 0 |
| 7 | Tsg = Csg * R + $t_{comp}$ | 0 | 0 | 1 | 1 | 0 | 0 | 1 | 1 | wherein $C_{ref}$, $C_{meas}$, Cs1 to Cs4, Csg represent the respective capacitances and resistance in the respective charging or discharging circuit of each measurement determined by a position of the respective switches S1 to S4 and T1 to T4, wherein each position "1" indicates that the respective switch is closed and conductive, wherein the position "0" indicates that the respective switch is open and non-conductive, wherein $t_{comp}$ represents a comparator running time;

determining the unknown capacitance to be measured $C_{meas}$ by $$C_{meas} = \frac{C_{ref} * (T_{21} + T_{22} - T_{23} - T_{sg})}{(T_{11} + T_{12} - T_{13} - T_{sg})}; \text{ and}$$

determining a sensor parameter based on said measured capacitance $C_{meas}$.

20. A method according to claim 19, wherein passing above or below a threshold voltage value necessary for determining the charging or discharging times is determined by means of a comparator.

21. A method according to claim 20, wherein the determination of the passing above or below of said voltage threshold value necessary for measuring the charging or discharging times takes place using a Schmitt trigger as the comparator.

22. A method according to claim 20, wherein the connection or disconnection of a voltage supply is provided by means of a transistor switch.

23. A method according to claim 19, wherein charging of the capacitances takes place with the resistor disconnected from ground.

24. A method according to claim 19, wherein switches are switched by a control unit, such as an analog multiplexer.

25. A method according to claim 19, wherein measurement takes place repeatedly with measuring frequencies of more than 0.5 kHz.

26. A method according to claim 19, wherein the measurements are performed with operating currents below 50 μA.

27. A method according to claim 19, wherein the time measurements are carried out by a time to digital converter (TDC).

* * * * *